(12) United States Patent
Uzhakov et al.

(10) Patent No.: US 7,406,675 B2
(45) Date of Patent: Jul. 29, 2008

(54) METHOD AND SYSTEM FOR IMPROVING AERIAL IMAGE SIMULATION SPEEDS

(75) Inventors: Sergey V. Uzhakov, Moscow (RU); Stanislav V. Aleshin, Moscow (RU); Marina Medvedeva, Moscow (RU)

(73) Assignee: LSI Corporation, Milpitas, CA (US)

( * ) Notice: Subject to any disclaimer, the term of this patent is extended or adjusted under 35 U.S.C. 154(b) by 122 days.

(21) Appl. No.: 11/305,542

(22) Filed: Dec. 16, 2005

(65) Prior Publication Data
US 2007/0143734 A1    Jun. 21, 2007

(51) Int. Cl.
*G06F 17/50*    (2006.01)

(52) U.S. Cl. .......................................... 716/19; 716/20

(58) Field of Classification Search ..................... 716/4, 716/19–20
See application file for complete search history.

(56) References Cited

U.S. PATENT DOCUMENTS

2006/0245660 A1* 11/2006 Hung ......................... 382/254

* cited by examiner

*Primary Examiner*—Jack Chiang
*Assistant Examiner*—Suresh Memula
(74) *Attorney, Agent, or Firm*—Strategic Patent Group, P.C.

(57) ABSTRACT

A method and system for improving aerial image simulation speeds. The method includes receiving a mask; generating a matrix of node values based on the mask, wherein each node value corresponds to a node of a plurality of nodes in a lattice; performing a one-dimensional (1-D) approximation of a plurality of first approximation values at corresponding first approximation points between pairs of nodes of the plurality of nodes; performing a two-dimensional (2-D) approximation of second approximation values at corresponding second approximation points between pairs of first approximation points, wherein Chebyshev polynomials are used to approximate the first approximation values and the second approximation values. According to the method and system disclosed herein, approximating values using Chebyshev polynomials results in high-resolution aerial images that are generated at faster speeds.

27 Claims, 6 Drawing Sheets

METHOD AND SYSTEM FOR IMPROVING AERIAL IMAGE SIMULATION SPEEDS

FIELD OF THE INVENTION

The present invention relates to integrated circuit fabrication, and more particularly to a method and system for improving aerial image simulation speeds.

BACKGROUND OF THE INVENTION

The minimum feature sizes of integrated circuits (ICs) have been shrinking for years. Commensurate with this size reduction, various process limitations have made IC fabrication more difficult. One area of fabrication technology in which such limitations have appeared is photolithography.

An integral component of a photolithographic apparatus is a "reticle" which includes a pattern corresponding to features at one layer in an IC design. As light passes through the reticle, it is refracted and scattered by the chromium edges. This causes the projected image to exhibit some rounding, and other optical distortions. While such effects pose relatively little difficulty in layouts with large feature sizes (e.g., layouts with critical dimensions above about 1 micron), they cannot be ignored in layouts having features smaller than about 1 micron. The problems become especially pronounced in IC designs having feature sizes near the wavelength of light used in the photolithographic process.

To remedy this problem, a reticle correction technique known as optical proximity correction (OPC) has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result, and a digital representation of a reticle or photomask design is modified to create an optically corrected or OPC mask. The modification is performed by a computer having appropriate software for performing OPC. A mask simulator is then used to emulate the wafer printing characteristics of the OPC mask during optical lithography, resulting in an OPC aerial image.

To calculate the quality of the OPC mask, process engineers manually compare the target design to the aerial image to determine if features patterned within the aerial image are within some threshold of the corresponding features in the target design. This is done by measuring distances between the points in the target design and the corresponding points in the aerial image. Evaluation of each point requires analysis of surrounding features in two-dimensions to determine whether problematic diffraction effects are likely. Places in the mask that result in distances greater than the specified threshold are corrected (e.g., serif or segment removal, for example), and the process is repeated until acceptable results are obtained. A problem with this process is that engineers must first manually identify the geometric points in the target design to compare to the aerial image, and then visually determine if the points in the target design are separated by less than the threshold from the corresponding points in the aerial image. Furthermore, when the aerial image deviates from the target design, the mask quality is typically analyzed only at particular locations.

During the simulation process, the aerial image is calculated based on intensity values at nodes of a lattice. During the simulation, the intensity values of the nodes are calculated and the first derivatives of those values are calculated at all of the nodes of the lattice. A problem with this process is that calculating the first derivatives of all the values for all of the nodes is time consuming, which slows down aerial image simulation speeds.

Accordingly, what is needed is a method and system for improving aerial image simulation speeds. The present invention addresses such a need.

SUMMARY OF THE INVENTION

A method and system for improving aerial image simulation speeds is disclosed. The method includes receiving a mask; generating a matrix of node values based on the mask, wherein each node value corresponds to a node of a plurality of nodes in a lattice; performing a one-dimensional (1-D) approximation of a plurality of first approximation values at corresponding first approximation points between pairs of nodes of the plurality of nodes; performing a two-dimensional (2-D) approximation of second approximation values at corresponding second approximation points between pairs of first approximation points, wherein Chebyshev polynomials are used to approximate the first approximation values and the second approximation values.

According to the method and system disclosed herein, approximating values using Chebyshev polynomials results in high-resolution aerial images that are generated at faster speeds.

DETAILED DESCRIPTION OF THE INVENTION

The present invention relates to integrated circuit fabrication, and more particularly to a method and system for improving aerial image simulation speeds. The following description is presented to enable one of ordinary skill in the art to make and use the invention, and is provided in the context of a patent application and its requirements. Various modifications to the preferred embodiment and the generic principles and features described herein will be readily apparent to those skilled in the art. Thus, the present invention is not intended to be limited to the embodiments shown, but is to be accorded the widest scope consistent with the principles and features described herein.

The preferred embodiment provides a method and system for calculating an aerial image. The method includes generating a matrix of node intensity values based on a mask, where each node intensity value corresponds to a node in a lattice. A first approximation (1-D approximation) is performed to approximate intensity values at first approximation points between pairs of nodes, and then a second approximation (2-D approximation) is performed to approximate more intensity values between pairs of the first approximation points. Chebyshev polynomials are used for both approximations.

According to the method and system disclosed herein, Chebyshev polynomials are used to approximate intensity values based on the initial intensity values provided by the mask without calculating first derivatives of the initial intensity values, since the first derivatives are inherent to the Chebyshev polynomials. As a result, high-resolution aerial images are generated at faster speeds.

Figure 1:
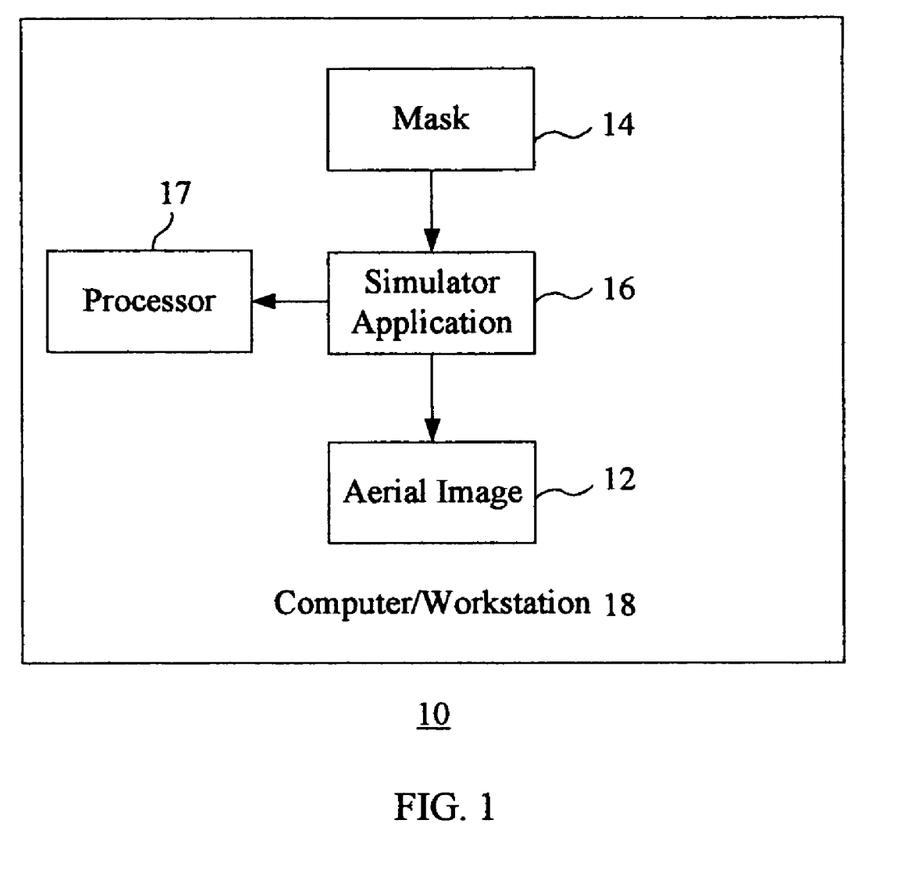
FIG. 1 is a block diagram illustrating a simulator system for creating an aerial image from a mask according to a preferred embodiment.

FIG. 1 is a block diagram illustrating a simulator system 10 for creating an aerial image 12 from a mask 14 according to a preferred embodiment. The system 10 includes a simulator application 16 executed on a processor 17 in a computer/workstation 18 or on a server that is accessed over a network (not shown). The workstation 18 preferably includes a microprocessor that is coupled to a non-volatile storage device, e.g. a conventional hard disk storage device. The microprocessor and the hard disk storage device are coupled to a volatile storage device, e.g. a random access memory (RAM). A monitor may be coupled to the workstation 18 for displaying a user interface.

The input to the simulator application 16 includes the mask 14. The mask 14 may be any type of mask (i.e. an OPC-corrected reticle pattern), and the mask 14 may have been constructed by a designer, by OPC program, or by external software, etc. The mask 14 is preferably described in an electronic format, e.g. graphic design system (GDS) or GDS II, which may represent individual features in the mask 14 as a set of x, y coordinates. According to one embodiment, the simulator application 16 analyzes the mask 14 to create the aerial image 12, which may be used in a variety of tasks (e.g., for mask correction, or quality analysis, etc.).

Figure 2A:
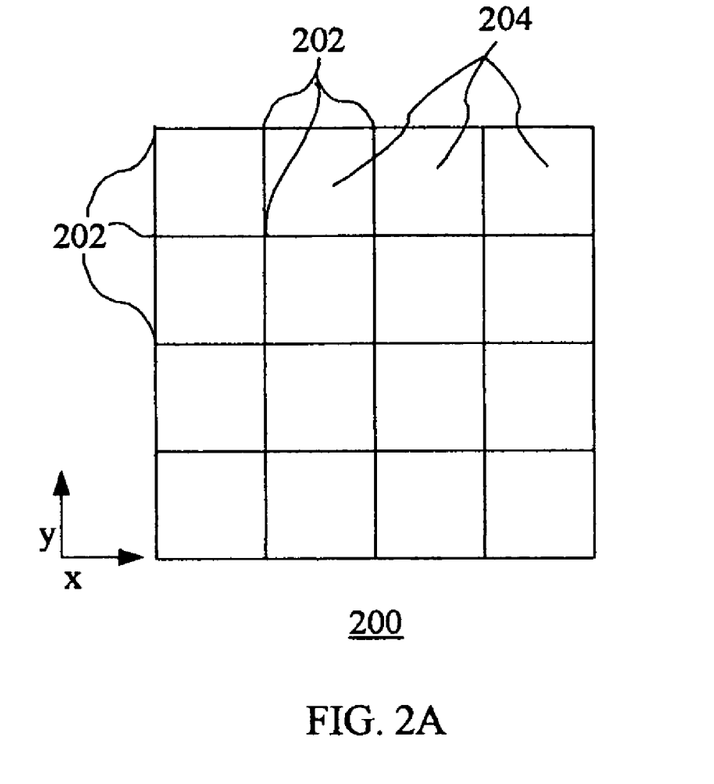
FIG. 2A is a diagram illustrating a region of a lattice according to a preferred embodiment.
Figure 2B:
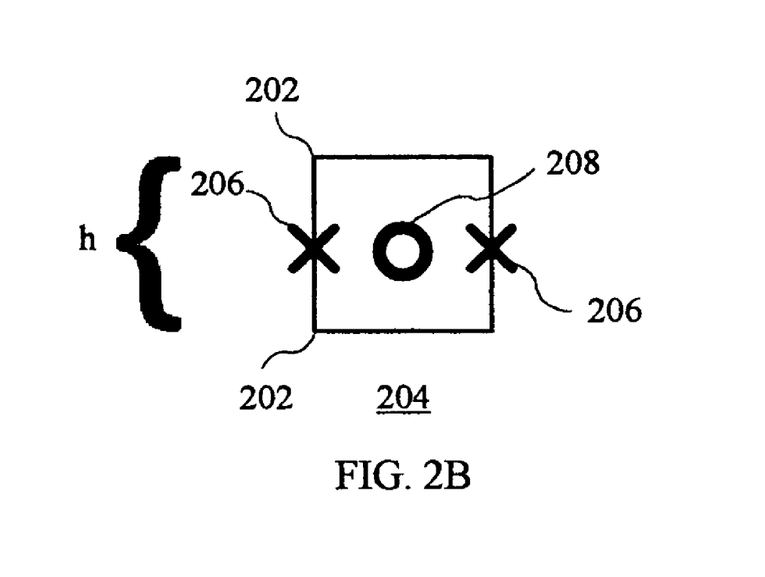
FIG. 2B is a diagram illustrating a square of FIG. 2A according to the preferred embodiment.

FIG. 2A is a diagram illustrating a region of a lattice 200 according to a preferred embodiment. The lattice 200, also referred to as a "mesh," includes an array of nodes 202 that are arranged such that the nodes 202 form an array of squares 204. In other words, there is a node 202 at each corner of a square 204. FIG. 2B is a diagram illustrating a square 204 of FIG. 2A. As FIG. 2B illustrates, a square 204 has four sides according to the preferred embodiment. The space between two neighboring nodes 202 is referred to as a "step," and each step has a length h. In other words, a side of a square may be referred to as a step. Because the nodes 202 form squares, the distances between the nodes 202 are equal. Accordingly, the lattice 200 is referred to as an "equal-step lattice."

Figure 3:
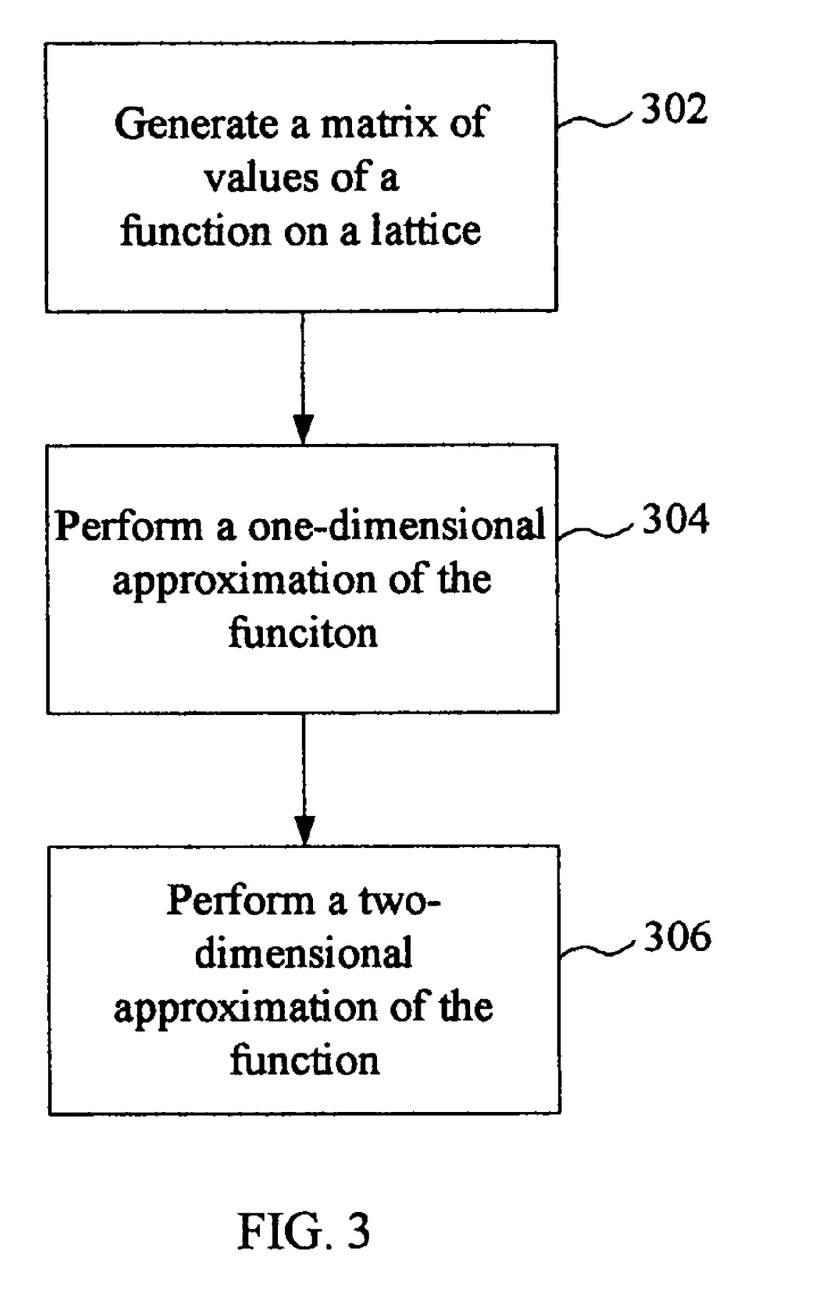
FIG. 3 is a flow diagram illustrating the process for creating an aerial image according to a preferred embodiment.

FIG. 3 is a flow diagram illustrating the process for creating an aerial image according to a preferred embodiment. Referring to FIGS. 2A, 2B, and 3 together, the simulator application 16 performs the process on each feature of the mask 14. According to the preferred embodiment, in step 302, the simulator application 16 generates a matrix of values (i.e., intensity values) of a function f(x,y) for each square 204 in the lattice 200. The values are derived from information provided by the mask. Each intensity value corresponds to a node 202 of the lattice 200.

A function f(x,y) is defined as a quantity of points x0, x1, ... xN−1 with constant step h. Each point (e.g., x0) may represent a node 202, which, as described above, has a corresponding intensity value. Each point may also represent an approximated point. The intensity values of the function f(x, y) at these points are known: f0, f1, ..., fN−1. Next, in step 304, the simulator application 16 performs a one-dimensional (1-D) approximation of values (i.e., intensity values) of the function f(x,y) at corresponding points 206 between pairs of nodes 202. The approximation is based on the intensity values of the nodes 202. The points 206 represent points of the aerial image 12 (FIG. 1). Note that approximating the values of the function f(x,y) at different points in the lattice 200 means the same as approximating the function f(x,y). Next, in step 306, the simulator application 16 performs a two-dimensional (2-D) approximation of values of the function f(x,y) at corresponding points 208 between pairs of points 206. The points 208 also represent points of the aerial image 12 but with a higher resolution. The 1-D and 2-D approximation steps 304 and 306 are described in detail below.

A. 1-D Approximation of a Function on a Square of an Equal-step Lattice

As described above in the 1-D approximation step 304, the simulator application 16 performs a 1-D approximation of values (i.e., intensity values) of the function f(x,y) at different points 206 between pairs of nodes 202 of the lattice. These points 206 represent points of the aerial image 12 (FIG. 1). The resulting step is a distance of h/2. Accordingly, the resulting lattice after 1-D approximation is referred to as an h/2 lattice.

As described above, a function f(x,y) is defined as a quantity of points x0, x1, ... xN−1 with a constant step h, where each of these points may represent a node. In a preferred embodiment, values of the function f(x,y) are approximated in the middle of two nodes according to the following expression: $(x_0+x_{N-1})/2$.

Figure 4A:
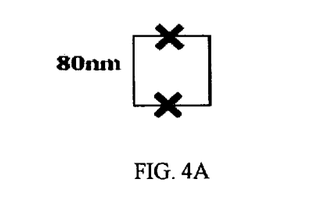
FIG. 4A illustrates an example where the simulator application approximates values at the middle of both the top and bottom sides of a square according to a preferred embodiment.
Figure 4B:
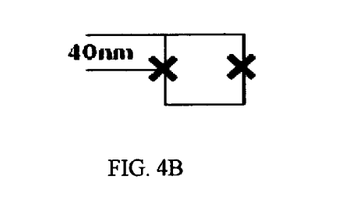
FIG. 4B illustrates an example where the simulator application approximates values at the middle of both the left and right sides of a square according to a preferred embodiment.
Figure 4C:
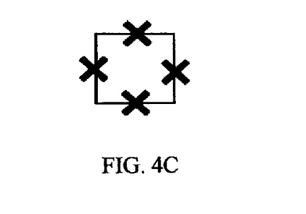
FIG. 4C illustrates an example where the simulator application approximates values at the middle of all of the sides of a square according to one embodiment.

FIGS. 4A, 4B, and 4C are diagrams illustrating possible locations on squares of a lattice where points may be approximated according to preferred embodiments. In accordance with the preferred embodiment, the simulator application uses only the intensity values of the lattice to approximate values of the function f(x,y) at various points. As a result, the approximation calculations are significantly decreased, because the simulator application 16 approximates the values without calculating first derivatives of the initial intensity values. In a preferred embodiment, the simulator application 16 approximates the values at either the top and bottom sides or the left and right sides of the squares. FIG. 4A illustrates an example where the simulator application 16 approximates values at the middle of both the top and bottom sides of a square. FIG. 4B illustrates an example where the simulator application 16 approximates values at the middle of both the left and right sides of a square. In an alternative embodiment, the simulator application 16 approximates values of the function f(x,y) at the middle of all of the sides of the squares during 1-dimensional approximation. FIG. 4C illustrates an example where the simulator application 16 approximates values at the middle of all of the sides of a square. In a preferred embodiment, Chebyshev polynomials are used to approximate the values at either the top and bottom sides of squares and/or the left and right sides of squares. Chebyshev polynomials are summarized below.

Chebyshev polynomials are defined by the following formulas:

$$T_0(x)=1;$$

$$T_1(x)=x; \text{ and}$$

$$T_{n+2}=2x*T_{n+1}-T_n, n>0, x \text{ from } [-1,1].$$

Some properties of Chebyshev polynomials are as follows:
1) $T_n(x)$—polynomial of degree n;
2) $T_{2k}(x)$—even function;
3) $T_{2k+1}(x)$—odd function;
4) $T_{2k+1}(0)=0$;
5) $T_{4k}(0)=1$;
6) $T_{4k+2}(0)=-1$; and
7) $T_n(\cos((2i+1)*/(2n)))=0$, $i=0 \ldots n-1$.

Chebyshev polynomials may be defined in another form:

$$T_n(x)=\cos(n*\arccos(x)).$$

As described above, Chebyshev polynomials are used to approximate the values at either the top and bottom sides of squares and/or the left and right sides of squares. In a preferred embodiment, the property $T_n(\cos((2i+1)*/(2n)))=0$, $i=0 \ldots n-1$ is used to approximate the values. The term $x_j$ is replaced with new values $z_j=\cos((2j+1)*/(2*N))$ from $[-1,1]$ and defines a new function $\phi(z)|\phi(z_j)=f(x)$ for $j=0 \ldots N-1$. The value of the function $\phi(z)$ is approximated at the point $z=0$ according to the following expression:

$c_0*T_0(z)+c_1*T_1(z)+ \ldots +c_{N-1}*T_{N-1}(z)$–polynomial of N–1 degrees, where $\phi(z_j)=c_0*T_0(z_j)+c_1*T_1(z_j)+ \ldots +c_{N-1}*T_{N-1}(z_j)$ for each j and $c_j$, which are unknown coefficients. The coefficients $c_j$ are determined according to the following expression:

$$c_j = \frac{\sum_{k=0}^{N-1} T_j(z_k)f(z_k)}{\sum T_j^2(z_k)}.$$

The denominator equals N if j=0. Otherwise, the denominator equals N/2. Next, the value of the function $\phi(z)$ is approximated at the point $z=0$ according to the following expression:

$\phi^*=c_0*T_0(0)+c_1*T_1(0)+ \ldots +c_{N-1}*T_{N-1}(0)$, where $\phi^*$ represents the approximated value of the function at a point between two nodes (e.g., in the middle of two nodes).

This formula can be further simplified:

$$\varphi^* = c_0 - c_2 + c_4 - c_6 + \ldots + / - c_{N-2}$$
$$= \sum_{k=0}^{N-1} \varphi_k \times (T_0(z_k) - 2T_2(z_k) + 2T_4(z_k) - 2T_6(z_k) \ldots ) / N$$
$$= \sum_{k=0}^{N-1} \varphi_k \times b_k.$$

$b_k$ may be calculated before the approximation, therefore the complexity of the method is N multiplications and N additions to 1 point. The term $b_k$ represents coefficients near $\phi\_k$. $b_k$ does not depend on function f(x,y) and depends on Chebyshev polynomials only. Accordingly, $b_k$ may be calculated before the operations described herein and used in the approximation. Finally, $\phi^*$ approximately equals $f((x_0+x_{N-1})/2)$.

C. 2-D Approximation of a Function on a Square of an Equal-step Lattice

As described above in the 2-D approximation step 306 (FIG. 3), the simulator application 12 performs a two-dimensional (2-D) approximation of values of the function f(x,y) at different points 208 between pairs of points 206 of the lattice. These points 208 represent points of the aerial image 12 but with higher resolution. A 2-D approximation of a function f(x) means applying a 1-D approximation a second time to approximate more points 208, where the 1-D approximation is based on the first points 206 instead of the original nodes 202. As described in further detail below, the resulting lattice, referred to as an h/4 lattice, has a higher resolution than an h/2 lattice, which is based on only one 1-D approximation.

Figure 5:
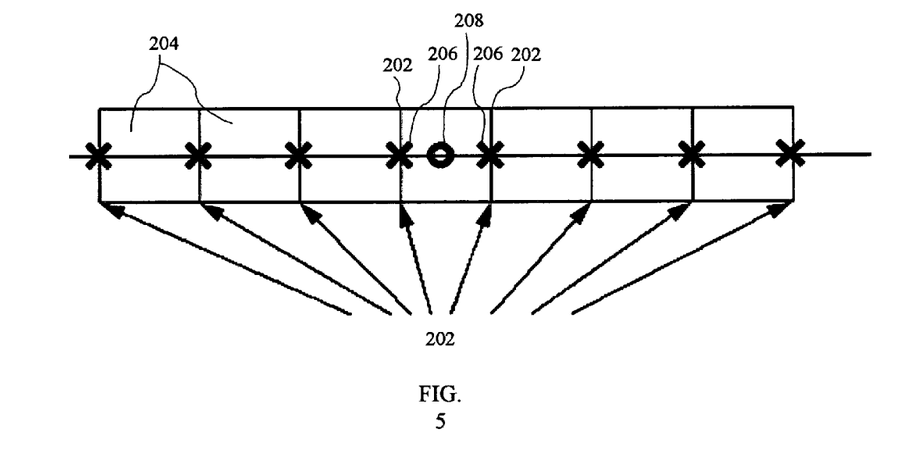
FIG. 5 is a diagram illustrating a row of squares of a lattice having M×M squares according to one embodiment.

FIG. 5 is a diagram illustrating a row of squares of a lattice 500 having M×M squares according to one embodiment. In one embodiment, the squares 204 include points 206 having approximated values of the function f(x,y). In one embodiment, the squares have steps that are 80 nm in length. Each approximated value ("X") results from vertical 1-D approximations based on the initial nodes. The resulting lattice after a first 1-D approximation has steps of 40 nm. In other words, the distance between an original node 202 and a neighboring point 206 is 40 nm. This particular approximation corresponds to the example shown in FIG. 4B, where the approximation is taken at the left and right sides of the squares. As this point, an 80×40 nm lattice will have been generated.

Next, a second 1-D approximation (horizontal 1-D approximation) produces a second approximated value 208 ("O"), which is based on approximated values 206. As shown, the second approximated value 208 is in the middle of a square. Approximations may also be taken at the top and bottom sides of the squares. Accordingly, at this point, a 40×40 nm lattice will have been generated. As described in more detail below, the entire process (i.e., 1-D and 2-D approximations) may be repeated to generate a 20×20 nm lattice.

In the preferred embodiment, the simulator application 16 approximates the function f(x,y) from a lattice where h=80 nm (h lattice) to a lattice where h/4=20 nm (h/4 lattice) in order to achieve higher resolutions. As described above, the simulator application 16 approximates values of function f(x,y) at all first order approximation points 206 points (i.e., at all sides of all squares) and at all second order approximation points 208 (i.e., in the middle of all squares). As a result the function f(x,y) is approximated from an h lattice (e.g., 80×80 nm) to an h/2 lattice (e.g., 40×40 nm). In the preferred embodiment, the simulator application 16 repeats the approximation of values of the function f(x,y) to produce a 20×20 nm lattice. This time, the lattice begins with 40 nm steps instead of 80 nm steps. The resulting approximated points are 20 nm apart, thus creating an h/4 lattice, where h/4=20 nm.

Figure 6:
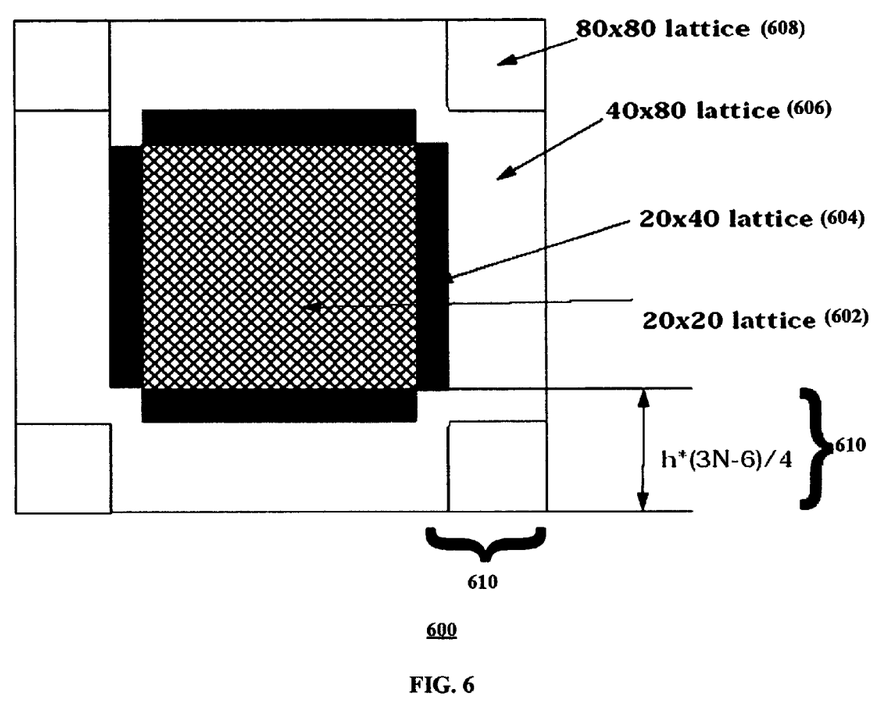
FIG. 6 is a diagram illustrating of a resulting lattice having several regions, where different sections have different resolutions according to one embodiment.

FIG. 6 is a diagram illustrating a resulting lattice 600 having several regions, where different sections have different resolutions according to one embodiment. In one embodiment, the lattice 600 is constructed from the approximations similar to those discussed above. For example, the central region 602 is an h/4 lattice (also labeled "20×20 lattice"). The region 604 (also labeled "20×40 lattice") is an area on which the simulator application 16 approximates the function f(x) for an h/4 lattice horizontally along an x-axis and approximated the function f(x) for an h/2 lattice vertically along a y-axis. The lattice 600 also includes a region 606 that is a 40×80 lattice and a region 608 that is an 80×80 lattice. The lattice 600 represents a top-view of an aerial image, where the lattice 600 has nodes in an X-Y plane having functional values (in a Z-coordinate). While the values at the nodes are not shown, the nodes help to indicate where 1-D approximations may be applied relative to those nodes.

After a 1-D approximation, going from an h lattice to an h/2 lattice, there is a border 610 having a length of (N−2)/2*h. The border includes one or more regions that are non-equal-step lattices. The size of the region 608 is (N−2)/2*h. After a 2-D approximation, going from an h/2 lattice to an h/4 lattice, the border increases by (N−2)/2*(h/2). The border 610 is (N−2)/2*h+(N−2)/2*(h/2)=(3N−6)*(h/4), as shown in FIG. 6. The size of the h*(3N−6)/4 border is approximately 648 nm in this specific example (assuming N=12 and h=86.4 nm). The resulting border 610 around the central region is relatively large.

In one embodiment, the values of the function f(x,y) are calculated in the central region 604 and not in the border 610. This is because an h/2×h/4 lattice is not an "equal-step lattice" in each direction (x-axis and y-axis) simultaneously. 1-D approximation may optionally be applied if there is a h/2 step along the x-axis and h/4 step along the y-axis. Additional algorithms may be used to obtain values for the entire lattice 600, including within the border 610. For example, the simulator application 16 may use Chebyshev polynomials on the equal-step lattice regions 602 and 608 and on the non-equal-step lattice regions 604 and 606. The following describes a way to decrease the size of the border 610.

Figure 7:
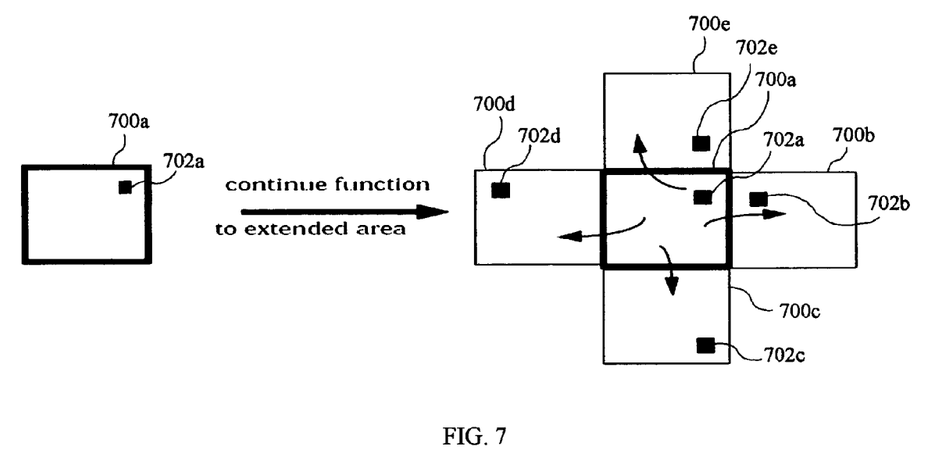
FIG. 7 is a diagram illustrating how known values from one square is transferred to multiple squares according to a preferred embodiment.

FIG. 7 is a diagram illustrating how known values from one square 700a are transferred to multiple squares 700b-700e according to a preferred embodiment. FIG. 7 shows a point 702a on an initial h lattice, where the point 702a has a known intensity value. Four other approximated points 702b-702e are created based on the known point 702a such that the resulting squares 700b-700e are each a mirror image of the square 700a. For example, squares 700a and 700b are mirror images. Similarly, squares 700a and 700c are mirror images. When the extended regions 700b-700e are created and 1-D approximations are applied multiple times, borders are formed inside the extended regions 700b-700e. These borders are not necessary. After nodes are approximated in a manner described to generate a 40×40 nm lattice and then a 20×20 nm lattice, the extended regions 700b-700e may be removed. As a result, the new values extend a lattice to help to avoid a border.

According to the system and method disclosed herein, the present invention provides numerous benefits. For example, it increases the speeds at which an aerial image is calculated by performing approximations based on intensity values and without calculating first derivatives of the intensity values.

A method and system for improving aerial image simulation speeds has been disclosed. The present invention has been described in accordance with the embodiments shown. One of ordinary skill in the art will readily recognize that there could be variations to the embodiments, and that any variations would be within the spirit and scope of the present invention. For example, the present invention can be implemented using hardware, software, a computer readable medium containing program instructions, or a combination thereof. Software written according to the present invention is to be either stored in some form of computer-readable medium such as memory or CD-ROM, or is to be transmitted over a network, and is to be executed by a processor. Consequently, a computer-readable medium is intended to include a computer readable signal, which may be, for example, transmitted over a network. Accordingly, many modifications may be made by one of ordinary skill in the art without departing from the spirit and scope of the appended claims.

We claim:

1. A method for generating an aerial image, the method comprising:
   receiving a mask;
   generating a matrix of node values based on the mask, wherein each node value corresponds to a node of a plurality of nodes in a lattice;
   performing a one-dimensional (1-D) approximation of a plurality of first approximation values at corresponding first approximation points between pairs of nodes of the plurality of nodes;
   performing a two-dimensional (2-d) approximation of second approximation values at corresponding second approximation points between pairs of first approximation points, wherein chebyshev polynomials are used to approximate the first approximation values and the second approximation values; and
   wherein a Chebyshev polynomial is defined as $T_n(\cos((2i+1)*/(2n)))=0$, wherein n is a degree of the polynomial and i=0 ... n−1 is applied to the approximation process.

2. The method of claim 1 wherein the first approximation values and the second approximation values are approximated without calculating first derivatives of the node values.

3. The method of claim 1 wherein the node values, the first approximation values, and the second approximation values are intensity values of a function f(x,y).

4. The method of claim 3 wherein the function f(x,y) is defined as a quantity of points x0, x1, ... xN−1, and wherein each point represents at least one of a node, a first approximation point, and a second approximation point.

5. The method of claim 3 wherein each value is approximated according to the following expression:
   $\phi^* = c_0 * T_0(0) + c_1 * T_1(0) + \ldots + c_{N-1} * T_{N-1}(0)$, wherein $\phi^*$ represents the approximated value of the function, wherein $c_0, c_1, \ldots c_{N-1}$ denote coefficients, wherein $T_0(0), T_1(0), \ldots T_{N-1}(0)$ are Chebyshev polynomials, and N is a number of the first approximation points.

6. The method of claim 3 wherein the function f(x,y) is defined as a quantity of points x0, x1, ... xN−1, and wherein each of the node values, first approximation values, and second approximation values are approximated according to the following expression:
   $\phi^* \cong f((x_0 + x_{N-1})/2)$, wherein $\phi^*$ represents the approximated value of the function.

7. The method of claim 1 wherein the lattice comprises a plurality of squares having top sides, bottom sides, left sides, right sides, and corners, wherein a node is positioned at each corner, wherein the first approximation values are approximated between pairs of nodes at either the top and bottom sides and/or the left and right sides, and wherein the second approximation values are approximated between pairs of first approximation values at either the top and bottom sides and/or the left and right sides.

8. The method of claim 1 wherein the lattice is an equal-step lattice.

9. The method of claim 1 wherein after the 2-D approximation a resulting lattice has a border, wherein the border comprises one or more non-equal-step lattices.

10. A simulator system for generating an aerial image, comprising:
    a processor; and
    a simulator application executed on the processor for approximating values by,
    receiving a mask;

generating a matrix of node values based on the mask, wherein each node value corresponds to a node of a plurality of nodes in a lattice;

performing a one-dimensional (1-D) approximation of a plurality of first approximation values at corresponding first approximation points between pairs of nodes of the plurality of nodes; and performing a two-dimensional (2-d) approximation of second approximation values at corresponding second approximation points between pairs of first approximation points, wherein chebyshev polynomials are used to approximate the first approximation values and the second approximation values, wherein the node values, the first approximation values, and the second approximation values are intensity values of a function $f(x,y)$, and wherein each value is approximated according to the following expression:

$\phi^* = c_0 * T_0(0) + c_1 * T_1(0) + \ldots + c_{N-1} * T_{N-1}(0)$, wherein $\phi^*$ represents the approximated value of the function, wherein $c_0, c_1, \ldots c_{N-1}$ denote coefficients, wherein $T_0(0), T_1(0), \ldots T_{N-1}(0)$ are Chebyshev polynomials, and N is a number of the first approximation points.

11. The system of claim 10 wherein a Chebyshev polynomial property $T_n(\cos((2i+1)*/(2n)))=0$, wherein n is a degree of the polynomial and $i=0 \ldots n-1$ is applied to the approximation process.

12. The system of claim 10 wherein the first approximation values and the second approximation values are approximated without calculating first derivatives of the node values.

13. The system of claim 10 wherein the node values, the first approximation values, and the second approximation values are intensity values of a function $f(x,y)$.

14. The system of claim 13 wherein the function $f(x,y)$ is defined as a quantity of points $x0, x1, \ldots xN-1$, and wherein each point represents at least one of a node, a first approximation point, and a second approximation point.

15. The system of claim 13 wherein the function $f(x,y)$ is defined as a quantity of points $x0, x1, \ldots xN-1$, and wherein each of the node values, first approximation values, and second approximation values are approximated according to the following expression:

$\phi^* \cong f((x_0 + x_{N-1})/2)$, wherein $\phi^*$ represents the approximated value of the function.

16. The system of claim 10 wherein the lattice comprises a plurality of squares having top sides, bottom sides, left sides, right sides, and corners, wherein a node is positioned at each corner, wherein the first approximation values are approximated between pairs of nodes at either the top and bottom sides and/or the left and right sides, and wherein the second approximation values are approximated between pairs of first approximation values at either the top and bottom sides and/or the left and right sides.

17. The system of claim 10 wherein the lattice is an equal-step lattice.

18. The system of claim 10 wherein after the 2-D approximation a resulting lattice has a border, wherein the border comprises one or more non-equal-step lattices.

19. A computer-readable medium containing program instructions for generating an aerial image, the program instructions which when executed by a computer system cause the computer system to execute a method comprising:

receiving a mask;

generating a matrix of node values based on the mask, wherein each node value corresponds to a node of a plurality of nodes in a lattice;

performing a one-dimensional (1-D) approximation of a plurality of first approximation values at corresponding first approximation points between pairs of nodes of the plurality of nodes;

performing a two-dimensional (2-d) approximation of second approximation values at corresponding second approximation points between pairs of first approximation points, wherein chebyshev polynomials are used to approximate the first approximation values and the second approximation values; and wherein a Chebyshev polynomial is defined as $T_n(\cos((2i+1)*/(2n)))=0$, wherein n is a degree of the polynomial and $i=0 \ldots n-1$ is applied to the approximation process.

20. The computer-readable medium of claim 19 wherein the first approximation values and the second approximation values are approximated without calculating first derivatives of the node values.

21. The computer-readable medium of claim 19 wherein the node values, the first approximation values, and the second approximation values are intensity values of a function $f(x,y)$.

22. The computer-readable medium of claim 21 wherein the function $f(x,y)$ is defined as a quantity of points $x0, x1, \ldots xN-1$, and wherein each point represents at least one of a node, a first approximation point, and a second approximation point.

23. The computer-readable medium of claim 21 wherein each value is approximated according to the following expression:

$\phi^* = c_0 * T_0(0) + c_1 * T_1(0) + \ldots + c_{N-1} * T_{N-1}(0)$, wherein $\phi^*$ represents the approximated value of the function, wherein $c_0, c_1, \ldots c_{N-1}$ denote coefficients, wherein $T_0(0), T_1(0), \ldots T_{N-1}(0)$ are Chebyshev polynomials, and N is a number of the first approximation points.

24. The computer-readable medium of claim 21 wherein the function $f(x,y)$ is defined as a quantity of points $x0, x1, \ldots xN-1$, and wherein each of the node values, first approximation values, and second approximation values are approximated according to the following expression:

$\phi^* \cong f((x_0 + x_{N-1})/2)$, wherein $\phi^*$ represents the approximated value of the function.

25. The computer-readable medium of claim 19 wherein the lattice comprises a plurality of squares having top sides, bottom sides, left sides, right sides, and corners, wherein a node is positioned at each corner, wherein the first approximation values are approximated between pairs of nodes at either the top and bottom sides and/or the left and right sides, and wherein the second approximation values are approximated between pairs of first approximation values at either the top and bottom sides and/or the left and right sides.

26. The computer-readable medium of claim 19 wherein the lattice is an equal-step lattice.

27. The computer-readable medium of claim 19 wherein after the 2-D approximation a resulting lattice has a border, wherein the border comprises one or more non-equal-step lattices.

* * * * *